United States Patent
Lee et al.

(10) Patent No.: US 11,754,630 B2
(45) Date of Patent: Sep. 12, 2023

(54) METHOD AND DEVICE FOR DETERMINING TEMPERATURE ESTIMATING MODEL, AND BATTERY MANAGEMENT SYSTEM TO WHICH THE TEMPERATURE ESTIMATING MODEL IS APPLIED

(71) Applicant: LG Energy Solution, Ltd., Seoul (KR)

(72) Inventors: Bohyun Lee, Daejeon (KR); Minhee Park, Daejeon (KR)

(73) Assignee: LG Energy Solution, Ltd.

(*) Notice: Subject to any disclaimer, the term of this patent is extended or adjusted under 35 U.S.C. 154(b) by 261 days.

(21) Appl. No.: 17/414,004

(22) PCT Filed: Aug. 26, 2020

(86) PCT No.: PCT/KR2020/011375
§ 371 (c)(1),
(2) Date: Jun. 15, 2021

(87) PCT Pub. No.: WO2021/040396
PCT Pub. Date: Mar. 4, 2021

(65) Prior Publication Data
US 2022/0043065 A1 Feb. 10, 2022

(30) Foreign Application Priority Data
Aug. 29, 2019 (KR) .......................... 10-2019-0106742

(51) Int. Cl.
*G01R 31/367* (2019.01)
*G01R 31/382* (2019.01)
(Continued)

(52) U.S. Cl.
CPC ............. *G01R 31/367* (2019.01); *G01K 7/22* (2013.01); *G01R 31/382* (2019.01);
(Continued)

(58) Field of Classification Search
None
See application file for complete search history.

(56) References Cited

U.S. PATENT DOCUMENTS

| | | | |
|---|---|---|---|
| 6,076,964 A | 6/2000 | Wu et al. | |
| 6,877,012 B2 | 4/2005 | Ashida et al. | |

(Continued)

FOREIGN PATENT DOCUMENTS

| | | | |
|---|---|---|---|
| CN | 102494778 A | 6/2012 | |
| CN | 109987000 A | 7/2019 | |

(Continued)

OTHER PUBLICATIONS

Extended European Search Report and European Search opinion for European Patent Application No. 20858342.7 dated Jan. 20, 2022, 8 pgs.

(Continued)

*Primary Examiner* — Roy Y Yi
(74) *Attorney, Agent, or Firm* — Lerner David LLP

(57) ABSTRACT

A method for determining a temperature estimating model for estimating a temperature in a battery module includes: estimating temperatures using a preliminary verification profile with models based on respective parameter sets; calculating first errors corresponding to differences between measured and estimated temperatures; comparing whether respective first errors for the respective parameter sets are less than a first threshold value; for parameter sets having a first error that is less than the first threshold value, calculating a maximum error; extracting a second parameter set by calculating a product of the maximum error and a first value plus a product of the first error and a second value; estimating temperatures according to reverification profile; calculating a second error corresponding to a difference between measured temperatures of the reverification profile (Continued)

and estimated temperatures; and finalizing the model when the second error is less than a third threshold value.

14 Claims, 5 Drawing Sheets

(51) Int. Cl.
  *G01K 7/22* (2006.01)
  *H01M 10/42* (2006.01)
  *H01M 10/48* (2006.01)

(52) U.S. Cl.
  CPC ....... *H01M 10/425* (2013.01); *H01M 10/486* (2013.01); *H01M 2010/4271* (2013.01)

(56) References Cited

U.S. PATENT DOCUMENTS

| | | | |
|---|---|---|---|
| 6,892,208 B2 | 5/2005 | Ashida et al. |
| 9,069,725 B2 | 6/2015 | Jones |
| 2002/0087540 A1 | 7/2002 | Ashida et al. |
| 2010/0210041 A1 | 8/2010 | Chang et al. |
| 2011/0313777 A1 | 12/2011 | Baeckstroem et al. |
| 2013/0046727 A1 | 2/2013 | Jones |
| 2013/0171746 A1 | 7/2013 | Chang et al. |
| 2013/0231904 A1 | 9/2013 | Jones |
| 2014/0212000 A1 | 7/2014 | Yagcioglu et al. |
| 2015/0211122 A1 | 7/2015 | Chang et al. |
| 2015/0278160 A1 | 10/2015 | Jones |
| 2015/0309963 A1 | 10/2015 | Jones |
| 2015/0309964 A1 | 10/2015 | Jones |
| 2015/0339572 A1 | 11/2015 | Achin et al. |
| 2016/0335550 A1 | 11/2016 | Achin et al. |
| 2016/0364647 A1 | 12/2016 | Achin et al. |
| 2016/0380313 A1 | 12/2016 | Morita et al. |
| 2017/0022611 A9 | 1/2017 | Chang et al. |
| 2017/0243140 A1 | 8/2017 | Achin et al. |
| 2018/0026454 A1 | 1/2018 | Belkacem-Boussaid et al. |
| 2018/0046926 A1 | 2/2018 | Achin et al. |
| 2018/0060738 A1 | 3/2018 | Achin et al. |
| 2018/0060744 A1 | 3/2018 | Achin et al. |
| 2018/0329865 A1 | 11/2018 | Jones |
| 2019/0101908 A1 | 4/2019 | Park et al. |
| 2019/0271673 A1 | 9/2019 | Jones |
| 2019/0280493 A1 | 9/2019 | Belkacem-Boussaid et al. |
| 2020/0090075 A1 | 3/2020 | Achin et al. |
| 2020/0134489 A1 | 4/2020 | Achin et al. |
| 2020/0182847 A1 | 6/2020 | Jones |
| 2021/0048482 A1 | 2/2021 | Ukumori |

FOREIGN PATENT DOCUMENTS

| | | |
|---|---|---|
| JP | 2002189597 A | 7/2002 |
| JP | 4664581 B2 | 4/2011 |
| JP | 2012103220 A | 5/2012 |
| JP | 2013012617 A | 1/2013 |
| JP | 2014524629 A | 9/2014 |
| JP | 6555440 B1 | 8/2019 |
| KR | 100934410 B1 | 12/2009 |
| KR | 101307079 B1 | 9/2013 |
| KR | 20140067450 A | 6/2014 |
| KR | 20140092805 A | 7/2014 |
| KR | 101827108 B1 | 2/2018 |
| KR | 101850048 B1 | 5/2018 |
| KR | 20190022905 A | 3/2019 |
| KR | 20190096311 A | 8/2019 |
| WO | 2016038658 A1 | 3/2016 |
| WO | 2018075995 A1 | 4/2018 |

OTHER PUBLICATIONS

Rad, M. et al., "Adaptive Thermal Modeling of Li-ion Batteries", "Electrochimica Acta", Mar. 2013, pp. 183-195, Elsevier.
International Search Report for Application No. PCT/KR2020/011375, dated Dec. 1, 2020, 6 pages.

METHOD AND DEVICE FOR DETERMINING TEMPERATURE ESTIMATING MODEL, AND BATTERY MANAGEMENT SYSTEM TO WHICH THE TEMPERATURE ESTIMATING MODEL IS APPLIED

CROSS-REFERENCE TO RELATED APPLICATIONS

The present application is a national phase entry under 35 U.S.C. § 371 of International Application No. PCT/KR2020/011375 filed Aug. 26, 2020, published in Korean, which claims priority from Korean Patent Application No. 10-2019-0106742 filed Aug. 29, 2019, all of which are incorporated herein by reference.

TECHNICAL FIELD

The present disclosure relates to a method and device for determining a temperature estimating model, and a battery management system to which a temperature estimating model determined by the method for determining a temperature estimating model is applied.

BACKGROUND ART

To reduce a time for charging a battery module, a battery management system must sense a temperature deviation among a plurality of battery cells configuring the battery module, and must perform charging control on the battery module based on the sensed temperature deviation.

However, because of a limit of a battery manufacturing process and a cost, only one or two temperature sensors may be installed in the battery module, and points of the highest temperature and the lowest temperature may not be accurately detected in the battery module.

SUMMARY

The present invention has been made in an effort to provide a method and device for determining a temperature estimating model for estimating designation of a highest temperature and a lowest temperature of a battery, and a battery management system to which a temperature estimating model is applied.

An embodiment of the present invention provides a method for determining a temperature estimating model for estimating a temperature in a battery module, including: calculating a plurality of parameter sets for the selected model type; for each parameter set of the plurality of parameter sets: estimating the temperature by substituting input data of a preliminary verification profile with the parameter set; calculating a first error corresponding to a difference between a measured temperature of the preliminary verification profile and the estimated temperature for the parameter set; and comparing whether the first error is less than a first threshold value; extracting a plurality of first parameter sets corresponding to the parameter sets for which the first error is less than the first threshold value; for each of the plurality of first parameter sets; calculating a maximum error; comparing whether the maximum error is less than a second threshold value; and in response to the maximum error being less than the second threshold value, extracting a second parameter set by calculating a sum of (i) a product of the maximum error and a first weighting value; and (ii) a product of the first error and a second weighting value; estimating temperatures according to input data of a reverification profile corresponding to a selected second parameter set; calculating a second error corresponding to a difference between measured temperatures of the reverification profile and the temperatures estimated according to the input data of the reverification profile; and in response to the second error being less than a third threshold value, finalizing the temperature estimating model according to the selected second parameter set.

Each of preliminary verification profile and the reverification profile may include a respective temperature value of a temperature sensor, a respective current of a battery, a respective temperature value of cooling water, and a respective air temperature value changeable in at least a time-series way as input data.

The estimated temperatures may include either estimated highest temperatures or estimated lowest temperatures of the battery module, and the measured temperatures may include either measured highest temperatures or measured lowest temperatures of the battery module.

At least one of the first error and the second error may be a root mean square error (RMSE).

The method may further include selecting a reference profile as an initial value for building up the temperature estimating model, wherein the reference profile includes factors for estimating temperatures and measuring temperatures, and changing the factors of the reference profile when the first errors are equal to or greater than the first threshold value.

The method may further include changing the factors of the reference profile when the maximum error of each extracted first parameter set is equal to or greater than the second threshold value.

The method may further include changing the factors of the reference profile when the second error of the selected second parameter set is equal to or greater than the third threshold value.

Extracting the plurality of first parameter sets may include extracting the parameter sets of the plurality of parameters for which the first error belongs to a top i-number in ascending order from among the first errors of the plurality of parameter sets, wherein i is a predetermined value.

The method may further include extracting a plurality of second parameter sets for which the calculated sum belongs to a top j-number in ascending order from among the second errors, wherein j is a predetermined value.

Another embodiment of the present invention provides a device for determining a temperature estimating model for estimating a temperature in a battery module, including: a parameter set producer configured to select a model type for estimating a temperature according to a set of n parameters, and calculate a plurality of parameter sets for the selected model type; a modeling unit configured to, for each parameter set of the plurality of parameter sets, estimate the temperature by substituting input data of a preliminary verification profile with the parameter set; and an error calculator configured to, for each parameter set of the plurality of parameter sets, calculate a first error corresponding to a difference between a measured temperature of the preliminary verification profile and the estimated temperature for all the parameter set.

The modeling unit may be further configured to, for each parameter set of the plurality of parameter sets, compare whether the first error is less than a first threshold value, and extract a plurality of first parameter sets corresponding to the parameter sets for which the first error is less than the first threshold value.

The device may further include: a maximum error calculator configured to calculate a maximum error, compare whether the maximum error is less than a second threshold value, and, in response to the maximum error being less than the second threshold value, extract a second parameter set by calculating a sum of (i) a product of the maximum error and a first weighting value; and (ii) a product of the first error and a second weighting value; and a final model determining unit configured to estimate temperatures according to input data of a reverification profile corresponding to a selected second parameter set, calculate a second error corresponding to a difference between measured temperatures of the reverification profile and the temperatures estimated according to the input data of the reverification profile, and, in response to the second error being less than a third threshold value, finalize the temperature estimating model according to the selected second parameter set.

Each of preliminary verification profile and the reverification profile may include a respective temperature value of a temperature sensor, a respective current of a battery, a respective temperature value of cooling water, and a respective air temperature value changeable in at least a time-series way as input data.

The estimated temperatures may include either estimated highest temperatures or estimated lowest temperatures of the battery module, and the measured temperatures may include either measured highest temperatures or measured lowest temperatures of the battery module.

At least one of the first error and the second error may be a root mean square error (RMSE).

Another embodiment of the present invention provides a battery management system including a device of any of the embodiments described herein.

According to the embodiments of present disclosure, the method and device for determining a temperature estimating model for estimating designation of a highest temperature and a lowest temperature of a battery, and the battery management system to which a temperature estimating model is applied, are provided.

DETAILED DESCRIPTION

Figure 1:
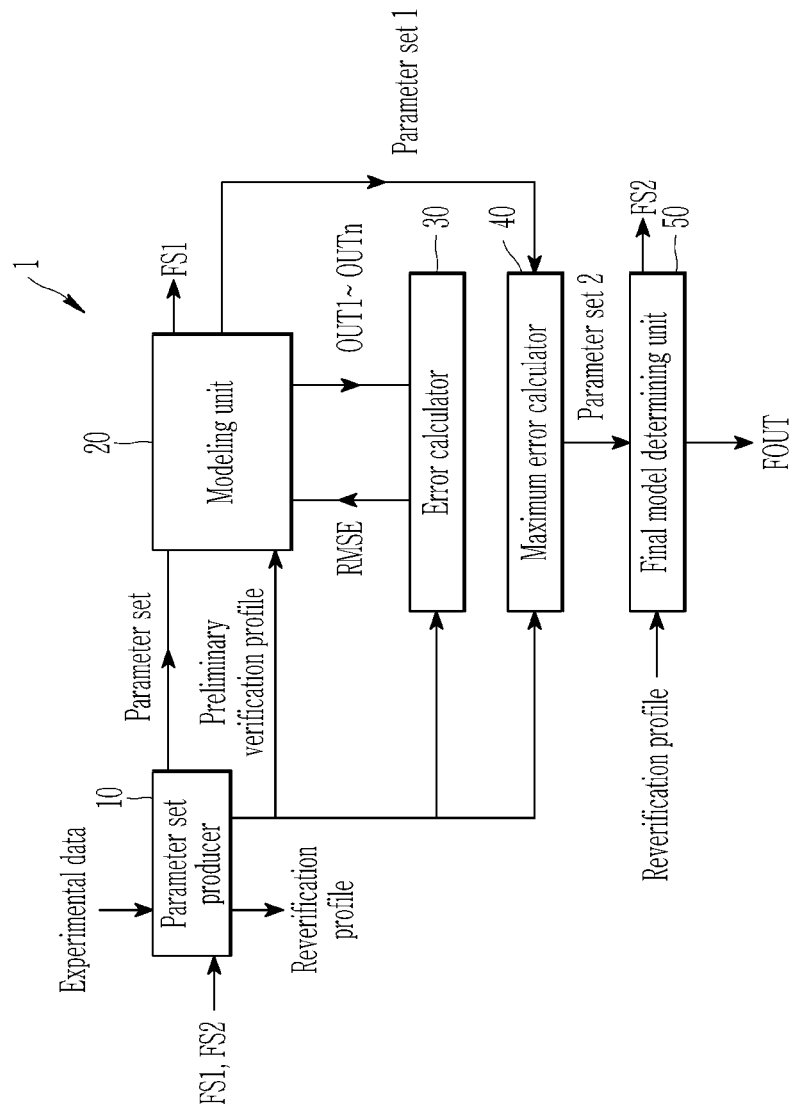
FIG. 1 shows a device for determining a temperature estimating model according to an embodiment.

An example of the present disclosure may deduce a logic for estimating a highest temperature and a lowest temperature in a battery module by using a measured thermistor value, a current flowing to a battery module, a cooling water temperature value, and a temperature value of external air based on a system identification method, and may finally improve a limit of the thermistor. The battery management system may control the charging in a more precise way by estimating the highest temperature and the lowest temperature in the battery module.

A method for determining a temperature estimating model for estimating a correlation between the maximum and lowest temperatures in the battery module based on a temperature value of the thermistor, a current of the battery, a temperature value of the cooling water, and a temperature value of external air, and a device for realizing the method, are provided.

Hereinafter, embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to make the specification easier. Therefore, these terms do not have meanings or roles that distinguish them from each other by themselves. In describing embodiments of the present specification, when it is determined that a detailed description of the well-known art associated with the present invention may obscure the gist of the present invention, it will be omitted. The accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like, will be used only to describe various components, and are not to be interpreted as limiting these components. The terms are only used to differentiate one component from other components.

It is to be understood that when one component is referred to as being "connected" or "coupled" to another component, it may be connected or coupled directly to another component or be connected or coupled to the other component with another component intervening therebetween. On the other hand, it is to be understood that when one component is referred to as being "connected or coupled directly" to another component, it may be connected to or coupled to the other component without another component intervening therebetween.

It will be further understood that terms "comprises" or "have" used in the present specification specifies the presence of stated features, numerals, steps, operations, components, parts, or a combination thereof, but does not preclude the presence or addition of one or more other features, numerals, steps, operations, components, parts, or combinations thereof.

FIG. 1 shows a device for determining a temperature estimating model according to an embodiment.

As shown in FIG. 1, the device 1 for determining a temperature estimating model includes a parameter set producer 10, a modeling unit 20, an error calculator 30, a maximum error calculator 40, and a final model determining unit 50.

Respective constituent elements described with reference to FIG. 1 represent an example for describing a configuration of a device for determining a highest temperature and lowest temperature estimating model, and in this instance, at least two constituent elements may be combined, one constituent element may be divided into at least two constituent elements, or an additional constituent element may be supplied, and other modifications are allowable, and the example described with reference to FIG. 1 does not limit the present disclosure.

Figure 2:
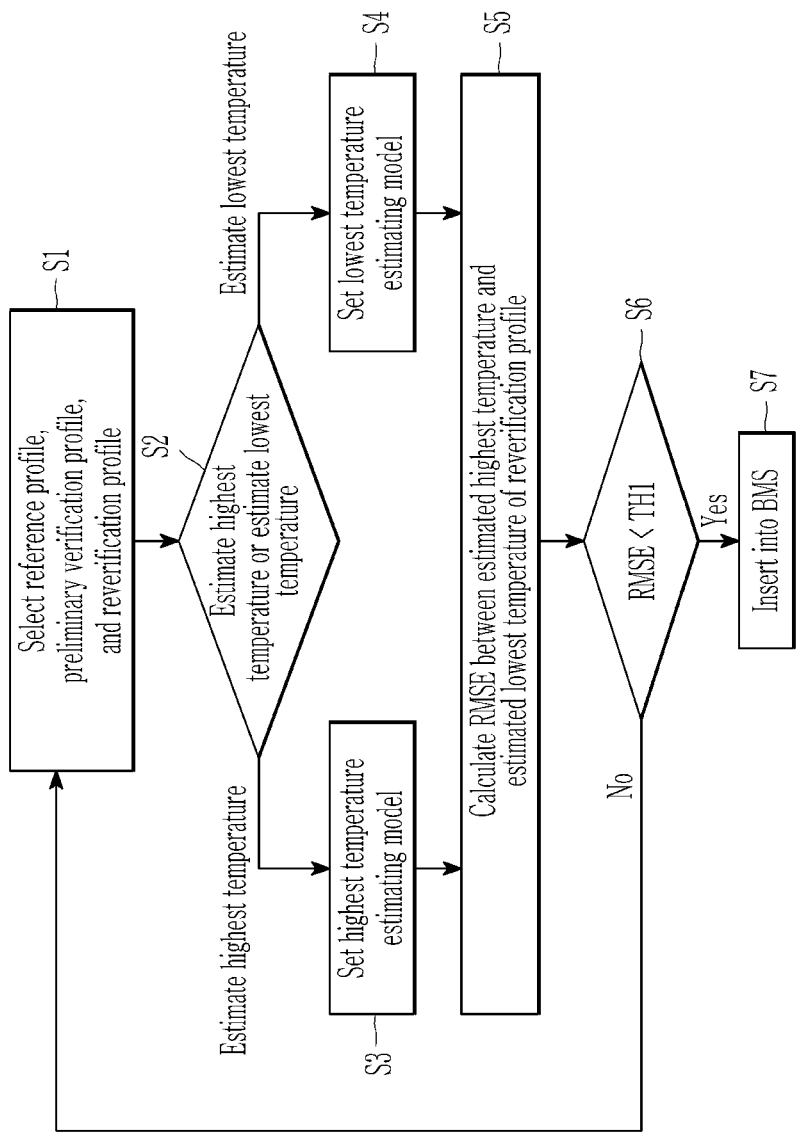
FIG. 2 shows a flowchart of a method for determining a temperature estimating model according to an embodiment.

FIG. 2 shows a flowchart of a method for determining a temperature estimating model according to an embodiment.

Figure 3:
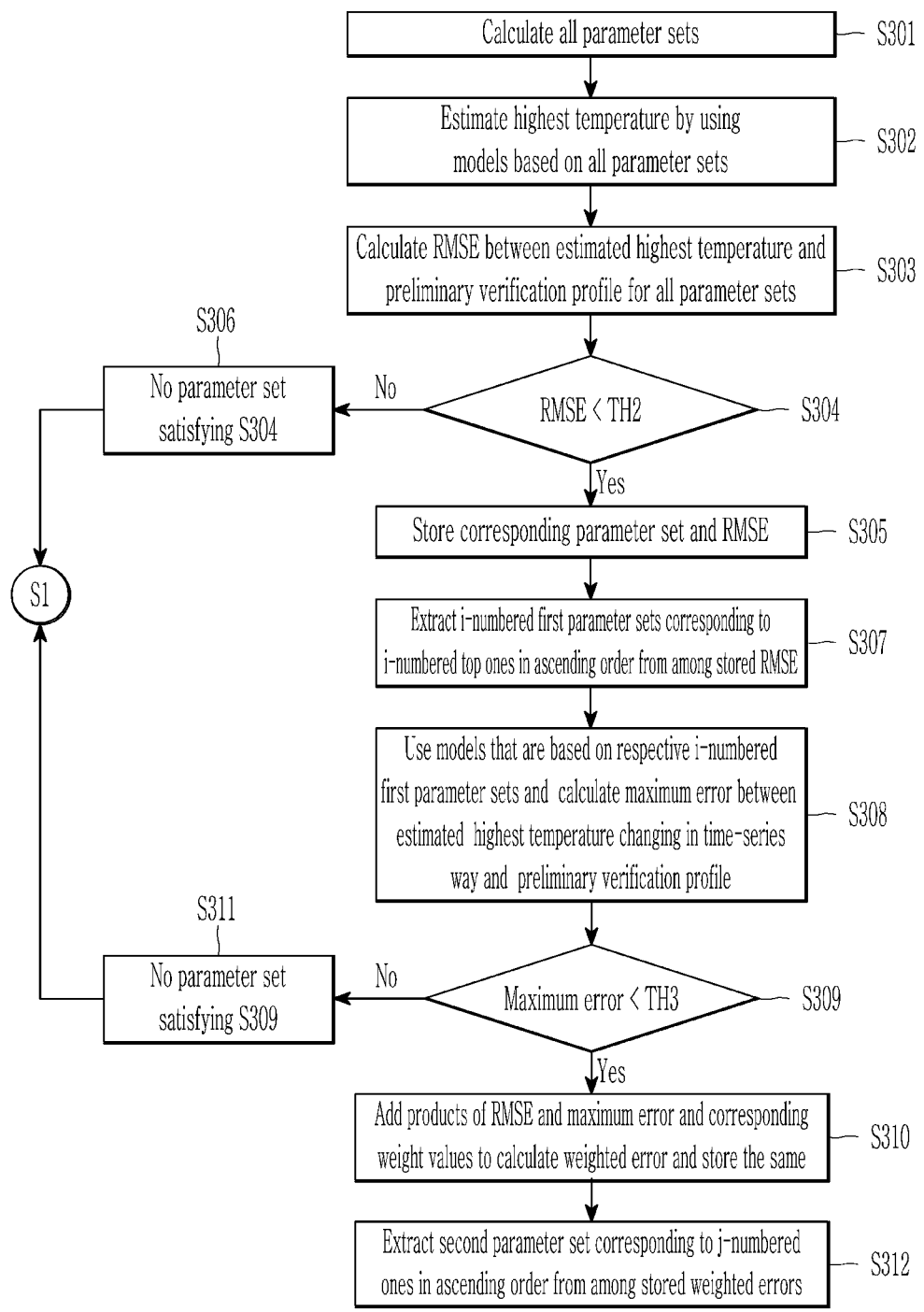
FIG. 3 shows a flowchart of a method for determining a highest temperature estimating model according to an embodiment.

FIG. 3 shows a flowchart of a method for determining a highest temperature estimating model according to an embodiment.

Figure 4:
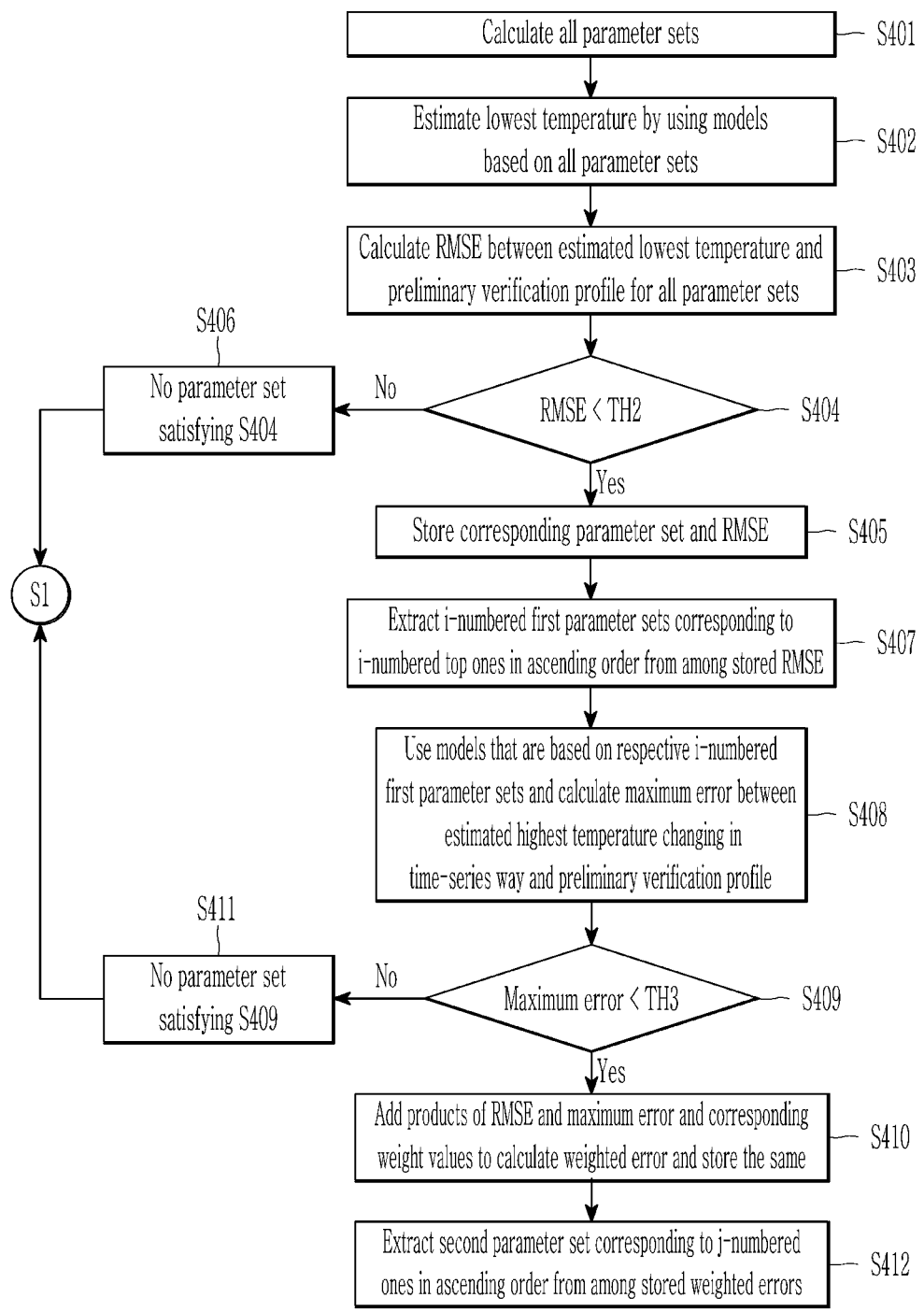
FIG. 4 shows a flowchart of a method for determining a lowest temperature estimating model according to an embodiment.

FIG. 4 shows a flowchart of a method for determining a lowest temperature estimating model according to an embodiment.

A device and method for determining a temperature estimating model according to an embodiment will now be described with reference to FIG. 1 to FIG. 4.

The parameter set producer 10 receives experimental data, and selects a reference profile, a preliminary verification profile, and a reverification profile (S1). The reference profile represents an initial value for building up a temperature estimating model, and it may include input data including factors for estimating temperatures and output data including measured temperatures. The preliminary verification profile provides data for determining a parameter set that is appropriate for a temperature estimating model from among all the parameter sets determined according to a number of parameters for estimating the temperature and a range of parameters. The reverification profile provides data for finally verifying a temperature estimating model.

The reference profile, the preliminary verification profile, and the reverification profile may include data including at least a temperature value of the thermistor, a current of the battery, a temperature value of the cooling water of the battery module, a temperature value of external air of the battery module, and highest and lowest temperatures in the battery module distinguished and arranged in a time-series way. In this instance, the temperature value of the thermistor, the current of the battery, the temperature value of the cooling water of the battery module, and the temperature value of external air of the battery module may be input data of the temperature estimating model, and the highest and lowest temperatures in the battery module may be output data of the temperature estimating model.

The device 1 for determining a temperature estimating model selects whether to estimate the highest temperature or estimate the lowest temperature (S2), sets a highest temperature estimating model in the case of estimating the highest temperature (S3), and sets a lowest temperature estimating model in the case of estimating the lowest temperature (S4). The settings of the highest temperature estimating model and the lowest temperature estimating model are performed in a same method, so respective steps described with reference to FIG. 3 and FIG. 4 will be described altogether.

The parameter set producer 10 selects a type of the model for estimating the highest temperature or the lowest temperature, and calculates all n-numbered parameter sets that are products of a number of parameters following the selected model type and a number of sections of the range of the respective parameters (S301 and S401). The types of the model for estimating the temperature include an Auto Regressive eXternal (ARX) model and a transfer function model.

All the parameter sets calculated by the parameter set producer 10 are transmitted to the modeling unit 20 together with the preliminary verification profile, and the modeling unit 20 substitutes the input data of the preliminary verification profile with the models that are based on all the respective parameter sets to estimate the highest temperatures or the lowest temperatures (S302 and S402).

The error calculator 30 calculates a root mean square error (RMSE) between the highest temperatures or the lowest temperatures that are output data of the preliminary verification profile and the estimated highest temperatures or the lowest temperatures that are outputs (OUT1 to OUTn) of the modeling unit 20 (S303 and S403). The outputs (OUT1 to OUTn) respectively include estimated highest temperatures or lowest temperatures when the temperature value of the thermistor, the current of the battery, the temperature value of the cooling water of the battery module, and the temperature value of external air of the battery module that are included in the preliminary verification profile and distinguished and arranged in a time-series way are input to the model defined by one parameter set, and the error calculator 30 may calculate the root mean square error (RMSE) by applying a square root to the result of mean square of differences between the output data corresponding to the input data in the preliminary verification profile and the estimated highest temperatures or lowest temperatures. The RMSE is an example for calculating an error between the estimated result and the actually measured result, but the present disclosure is not limited thereto.

The modeling unit 20 receives the RMSE from the error calculator 30, and compares whether the RMSE is less than a threshold value TH2 of the highest temperature or the lowest temperature (S304 and S404).

The modeling unit 20 stores the parameter set in which the RMSE is less than the threshold value TH2 and the RMSE (S305 and S405), finishes S304 or S404 for all the parameter sets, and extracts i-numbered first parameter sets corresponding to the i-numbered top ones in ascending order from among the stored RMSE (S307 and S407). The i represents the maximum number, and when the number of parameter sets in which the RMSE is less than the threshold value TH2 is equal to or less than i in S304 or S404, the corresponding parameter sets are extracted as the first parameter sets.

When determining that there are no parameter sets that satisfy S304 and S404 (S306 and S406), the modeling unit 20 transmits a failure signal FS1 to the parameter set producer 10 to notify of this, and the parameter set producer 10 changes the reference profile according to S1. In this instance, as the reference profile changes, at least one of the preliminary verification profile and the reverification profile may be changed together. The first parameter set is transmitted to the maximum error calculator 40 together with the preliminary verification profile.

The maximum error calculator 40 uses the models that are based on the respective i-numbered first parameter sets, and calculates the maximum error between the estimated highest temperature or the estimated lowest temperature that changes in a time-series way and the measured highest temperature or the lowest temperature of the output data in the preliminary verification profile (S308 and S408). As described above, the preliminary verification profile includes input data and output data that are distinguished and arranged in a time-series way, and the maximum error signifies the biggest error from among the errors between the highest temperatures or the lowest temperatures estimated according to the input data changeable in a time-series way and the output data corresponding to the input data, that is, the measured highest temperatures or the lowest temperatures.

The maximum error calculator 40 compares whether the maximum errors of the respective first parameter sets are less than a threshold value TH3 (S309 and S409).

The maximum error calculator 40, for a parameter set whose maximum errors are less than the threshold TH3, adds a product of multiplying the RMSE calculated by the error calculator 30 in S303 or S403 and a corresponding weight value with a product of multiplying a maximum error and a corresponding weight value to calculate a weighted error, and stores the weighted error (S310) and (S410).

When determining as that there is no parameter sets that satisfy S309 and S408 (S311 and S411), the maximum error calculator 40 transmits a failure signal FS2 to the parameter set producer 10 to notify of this, and the parameter set producer 10 changes the reference profile according to S1. In this instance, as the reference profile changes, at least one of the preliminary verification profile and the reverification profile may be changed together.

The maximum error calculator 40 extracts the second parameter sets corresponding to j-numbered ones in ascending order from among the stored weighted errors in S310 or S410 (S312 and S412). The j represents the maximum number, and when the number of the parameter sets in which the maximum error is less than the threshold value TH3 is equal to or less than j in S309 or S409, the corresponding parameter sets are extracted as a second parameter set. The second parameter set is transmitted to the final model determining unit 50 together with the reverification profile.

The final model determining unit 50 estimates the highest temperature or the lowest temperature according to the input data of the reverification profile, and calculates the RMSE between the measured highest temperatures or lowest temperatures that are output data of the reverification profile and the estimated highest temperatures or estimated lowest temperatures (S5).

The final model determining unit 50 compares whether the RMSE is less than the threshold value TH1 (S6).

When the RMSE is less than the threshold value TH1 according to a comparison result in S6, the final model determining unit 50 may determine the model based on the corresponding parameter set to be a final model (FOUT). When the RMSE of at least two second parameter sets from among the j-numbered second parameter sets is less than the threshold value TH1, the second parameter set corresponding to the least RMSE may be selected.

The final model (FOUT) is divided into a highest temperature estimating model for the highest temperature and a lowest temperature estimating model for the lowest temperature, and it may be inserted into the battery management system (S7).

Figure 5:
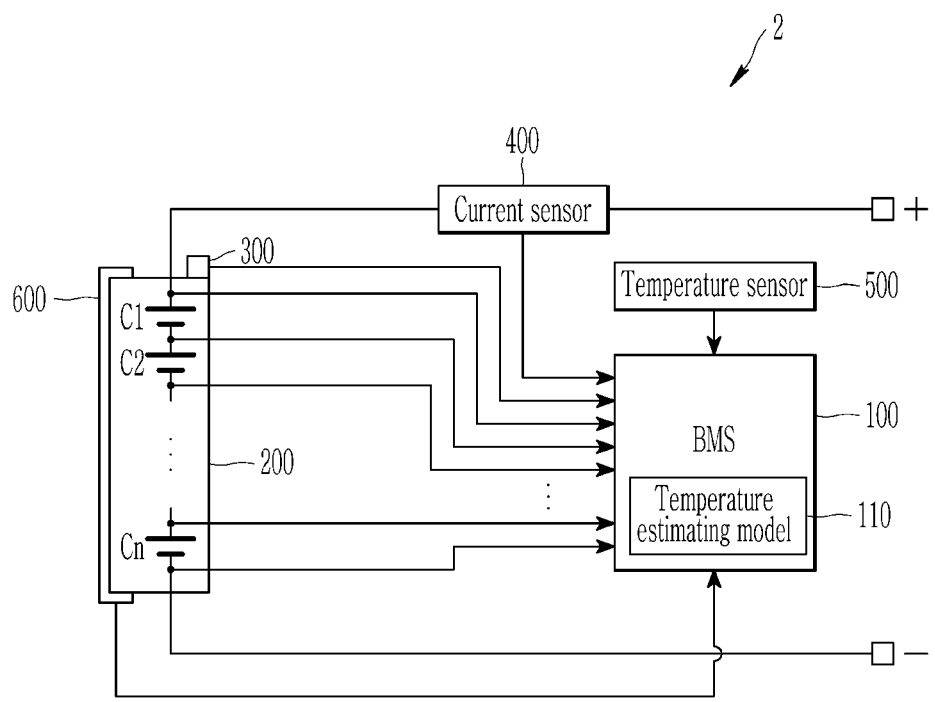
FIG. 5 shows a battery system including a battery management system to which a temperature estimating model is applied according to an embodiment.

FIG. 5 shows a battery system including a battery management system to which a temperature estimating model is applied according to an embodiment.

As shown in FIG. 5, the battery system 2 includes a battery management system (BMS) 100, a battery module 200, at least two temperature sensors 300 and 500, a current sensor 400, and a cooling unit 600.

The BMS 100 includes a temperature estimating model 110 determined by an embodiment described with reference to FIG. 1 to FIG. 4. The temperature estimating model 110 may estimate at least one of the highest temperature and the lowest temperature of the battery module 200.

The battery module 200 includes a plurality of battery cells connected in series/in parallel with each other, so it may supply a needed power voltage. FIG. 5 illustrates that the battery module 200 includes a plurality of battery cells (C1 to Cn) connected in series with each other, and is connected between two output ends (+ and −) of the battery system 2, but the constituent elements and the relationship among them described with reference to FIG. 5 are an example, and the present disclosure is not limited thereto.

The temperature sensor 300 measures the temperature of the battery module 200, and transmits information for indicating the measured temperature to the BMS 100. The temperature sensor 300 may be realized with a thermistor, and the value measured by the thermistor may be information for indicating the measured temperature. FIG. 5 illustrates one temperature sensor 300 attached to the battery module 200, but the present disclosure is not limited thereto, and two or more temperature sensors may be attached to the battery module 200.

The current sensor 400 is connected in series between a positive electrode of the battery module 200 and the output end (+), measures the current flowing to the battery module 200, and transmits information for indicating the measured current to the BMS 100.

The temperature sensor 500 measures a temperature of external air, and transmits information on the measured temperature of external air to the BMS 100.

The cooling unit 600 may be positioned to contact at least one side of the battery module 200, and may reduce the temperature of the battery module 200. The cooling water is supplied into the cooling unit 600, and the cooling unit 600 measures the temperature of the cooling water and transmits information for indicating the measured temperature of the cooling water to the BMS 100.

The measurement value of the thermistor, the current flowing to the battery, the temperature value of external air, and the temperature value of the cooling water transmitted to the BMS 100 are input to the temperature estimating model 110, and the temperature estimating model 110 may estimate at least one of the highest temperature and the lowest temperature of the battery module 200.

According to the above-described example, the highest temperature and the lowest temperature in the battery module may be accurately estimated, thereby solving the problem of conventional art for measuring the temperature of the battery module depending on the measurement value of the thermistor.

Further, the highest temperature and the lowest temperature in the battery module may be accurately estimated, so the battery management system for more precisely controlling the output of the battery module may be provided.

While this invention has been described in connection with what is presently considered to be practical embodiments, it is to be understood that the invention is not limited to the disclosed embodiments, but on the contrary, is intended to cover various modifications and equivalent arrangements included within the spirit and scope of the appended claims.

The invention claimed is:

1. A method for determining a temperature estimating model for estimating a temperature in a battery module comprising:
  selecting a model type for estimating a temperature according to a set of n parameters, wherein n is a positive integer;
  calculating a plurality of parameter sets for the selected model type;
  for each parameter set of the plurality of parameter sets:
    estimating the temperature by substituting input data of a preliminary verification profile with the parameter set;

calculating a first error corresponding to differences between measured temperatures of the preliminary verification profile and the estimated temperatures for the parameter set; and comparing whether the first error is less than a first threshold value;

extracting a plurality of first parameter sets corresponding to the parameter sets for which the first error is less than the first threshold value;

for each of the plurality of first parameter sets:

calculating a maximum error that is a biggest error from among the differences between the measured temperatures of the preliminary verification profile and the estimated temperatures for the parameter set;

comparing whether the maximum error is less than a second threshold value; and in response to the maximum error being less than the second threshold value, extracting a second parameter set by calculating a sum of (i) a product of the maximum error and a first weighting value; and (ii) a product of the first error and a second weighting value;

estimating temperatures according to input data of a reverification profile corresponding to a selected second parameter set;

calculating a second error corresponding to a difference between measured temperatures of the reverification profile and the temperatures estimated according to the input data of the reverification profile; and in response to the second error being less than a third threshold value, finalizing the temperature estimating model according to the selected second parameter set.

2. The method of claim 1, wherein
each of the preliminary verification profile and the reverification profile includes:
a respective temperature value of a temperature sensor, a respective current of a battery, a respective temperature value of cooling water, and a respective air temperature value changeable in at least a time-series way as input data.

3. The method of claim 1, wherein
the estimated temperatures include either estimated highest temperatures or estimated lowest temperatures of the battery module, and
wherein the measured temperatures include either measured highest temperatures or measured lowest temperatures of the battery module.

4. The method of claim 1, wherein
at least one of the first error or the second error is a root mean square error (RMSE).

5. The method of claim 1, further comprising
selecting a reference profile as an initial value for building up the temperature estimating model, wherein the reference profile includes factors for estimating temperatures and measuring temperatures; and
changing the factors of the reference profile when the first errors are equal to or greater than the first threshold value.

6. The method of claim 5, further comprising
changing the factors of the reference profile when the maximum error of each extracted first parameter set is equal to or greater than the second threshold value.

7. The method of claim 6, further comprising
changing the factors of the reference profile when the second error of the selected second parameter set is equal to or greater than the third threshold value.

8. The method of claim 1, wherein
extracting the plurality of first parameter sets includes:
extracting the parameter sets of the plurality of parameters for which the first error belongs to a top i-number in ascending order from among the first errors of the plurality of parameter sets, wherein i is a predetermined value.

9. The method of claim 1, further comprising:
extracting a plurality of second parameter sets for which the calculated sum belongs
to a top j-number in ascending order from among the second errors, wherein j is a predetermined value.

10. A device for determining a temperature estimating model for estimating a temperature in a battery module, comprising:
a parameter set producer configured to select a model type for estimating a temperature according to a set of n parameters, wherein n is a positive integer, and calculate a plurality of parameter sets for the selected model type;
a modeling unit configured to, for each parameter set of the plurality of parameter sets, estimate the temperature by substituting input data of a preliminary verification profile with the parameter set; and
an error calculator configured to, for each parameter set of the plurality of parameter sets, calculate a first error corresponding to differences between measured temperatures of the preliminary verification profile and the estimated temperatures for all the parameter set,
wherein the modeling unit is configured to, for each parameter set of the plurality of parameter sets, compare whether the first error is less than a first threshold value, and extracts a plurality of first parameter sets corresponding to the parameter sets for which the first error is less than the first threshold value,
wherein the device further includes:
a maximum error calculator configured to calculate a maximum error that is a biggest error from among the differences between the measured temperatures of the preliminary verification profile and the estimated temperatures for the parameter set, compare whether the maximum error is less than a second threshold value, and, in response to the maximum error being less than the second threshold value, extract a second parameter set by calculating a sum of (i) a product of the maximum error and a first weighting value; and (ii) a product of the first error and a second weighting value; and
a final model determining unit configured to estimate temperatures according to input data of a reverification profile corresponding to a selected second parameter set, calculate a second error corresponding to a difference between measured temperatures of the reverification profile and the temperatures estimated according to the input data of the reverification profile, and, in response to the second error being less than a third threshold value, finalize the temperature estimating model according to the selected second parameter set.

11. The device of claim 10, wherein
each of the preliminary verification profile and the reverification profile includes a respective temperature value of a temperature sensor, a respective current of a battery, a respective temperature value of cooling water, and a respective temperature value of air changeable in at least a time-series way as input data.

12. The device of claim 10, wherein
the estimated temperatures include either estimated highest temperatures or estimated lowest temperatures of the battery module, and
the measured temperatures include either measured highest temperatures or measured lowest temperatures of the battery module.

13. The device of claim 10, wherein
at least one of the first error or the second error is a root mean square error (RMSE).

14. A battery management system comprising the device of claim 10.

* * * * *